US008841691B2

(12) United States Patent
Richardson et al.

(10) Patent No.: US 8,841,691 B2
(45) Date of Patent: Sep. 23, 2014

(54) LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS

(71) Applicant: The Regents of the University of California, Oakland, CA (US)

(72) Inventors: Jacob J. Richardson, Santa Barbara, CA (US); Daniel B. Thompson, Walnut Creek, CA (US); Ingrid Koslow, Berlin (DE); Jun-Seok Ha, Oviedo, FL (US); Frederick F. Lange, Santa Barbara, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/970,046

(22) Filed: Aug. 19, 2013

(65) Prior Publication Data
US 2013/0328012 A1 Dec. 12, 2013

Related U.S. Application Data

(63) Continuation of application No. 12/938,872, filed on Nov. 3, 2010, now Pat. No. 8,536,618.

(60) Provisional application No. 61/257,811, filed on Nov. 3, 2009, provisional application No. 61/257,812, filed on Nov. 3, 2009, provisional application No. 61/257,814, filed on Nov. 3, 2009.

(51) Int. Cl.
| H01L 33/60 | (2010.01) |
| H01L 33/44 | (2010.01) |
| H01L 33/28 | (2010.01) |
| H01L 33/14 | (2010.01) |
| H01L 33/32 | (2010.01) |
| H01L 33/00 | (2010.01) |

(52) U.S. Cl.
CPC ............. *H01L 33/44* (2013.01); *H01L 33/28* (2013.01); *H01L 33/007* (2013.01); *H01L 33/14* (2013.01); *H01L 33/32* (2013.01)
USPC ...... 257/98; 257/103; 257/183; 257/E33.028; 257/E33.074; 438/29; 438/46

(58) Field of Classification Search
USPC ............ 257/93, 103, 183, E33.067, E33.074; 438/29, 46
See application file for complete search history.

(56) References Cited

U.S. PATENT DOCUMENTS

| 3,721,611 A | 3/1973 | Jones |
| 6,458,673 B1 | 10/2002 | Cheung |

(Continued)

FOREIGN PATENT DOCUMENTS

| CN | 101319370 | 12/2008 |
| CN | 101504961 | 8/2009 |

(Continued)

OTHER PUBLICATIONS

International Search Report dated Dec. 30, 2010, International application No. PCT/US2010/055278, International filing date Nov. 3, 2010.

(Continued)

*Primary Examiner* — John C Ingham
(74) *Attorney, Agent, or Firm* — Gates & Cooper LLP

(57) ABSTRACT

A method of fabricating a Light Emitting Diode with improved light extraction efficiency, comprising depositing a plurality of Zinc Oxide (ZnO) nanorods on one or more surfaces of a III-Nitride based LED, by growing the ZnO nanorods from an aqueous solution, wherein the surfaces are different from c-plane surfaces of III-Nitride and transmit light generated by the LED.

20 Claims, 6 Drawing Sheets

(56) References Cited

U.S. PATENT DOCUMENTS

| | | |
|---|---|---|
| 7,265,037 B2 | 9/2007 | Yang et al. |
| 7,595,514 B2 | 9/2009 | Lai |
| 7,719,020 B2 | 5/2010 | Murai et al. |
| 7,767,140 B2 | 8/2010 | Min et al. |
| 7,994,527 B2 | 8/2011 | DenBaars et al. |
| 8,294,166 B2 | 10/2012 | Nakamura et al. |
| 8,299,473 B1 | 10/2012 | D'Evelyn et al. |
| 8,334,151 B2 | 12/2012 | Murai et al. |
| 2003/0084838 A1 | 5/2003 | McCandlish et al. |
| 2004/0089868 A1 | 5/2004 | Hon et al. |
| 2004/0105810 A1 | 6/2004 | Ren et al. |
| 2004/0265507 A1 | 12/2004 | Xiong et al. |
| 2005/0009224 A1 | 1/2005 | Yang et al. |
| 2005/0179051 A1 | 8/2005 | Kondoh et al. |
| 2005/0179052 A1 | 8/2005 | Yi et al. |
| 2006/0261323 A1 | 11/2006 | Suh et al. |
| 2007/0001186 A1 | 1/2007 | Murai et al. |
| 2007/0222353 A1 | 9/2007 | Ren et al. |
| 2007/0287194 A1 | 12/2007 | Childs et al. |
| 2008/0073659 A1 | 3/2008 | Tamura et al. |
| 2009/0052159 A1 | 2/2009 | Abe et al. |
| 2009/0098043 A1 | 4/2009 | Song et al. |
| 2009/0146170 A1* | 6/2009 | Zhong et al. .................. 257/98 |
| 2010/0038638 A1 | 2/2010 | Tao et al. |
| 2010/0263586 A1 | 10/2010 | Richardson et al. |
| 2010/0308323 A1 | 12/2010 | Chang Jean et al. |
| 2011/0089398 A1 | 4/2011 | Pan et al. |
| 2011/0101414 A1 | 5/2011 | Thompson et al. |
| 2011/0108873 A1 | 5/2011 | Richardson et al. |
| 2011/0127551 A1 | 6/2011 | Pan et al. |
| 2011/0180783 A1 | 7/2011 | Gao |

FOREIGN PATENT DOCUMENTS

| | | |
|---|---|---|
| JP | 2007242645 | 9/2007 |
| JP | 2007299953 | 11/2007 |
| JP | 2009049301 | 3/2009 |
| JP | 2009239075 | 10/2009 |

OTHER PUBLICATIONS

An, S. et al., "Enchanced light output of GaN-based light-emitting diodes with ZnO nanorod arrays," Applied Physics Letters 92, 121108 (2008).

Kim, J. et al., "Growth of heteroepitaxial ZnO thin films on GaN-buffered Al2O3 (0001) substrates by low-temperature hydrothermal synthesis at 90oC," Adv. Funct. Mater. 2007, 17, 463-471.

Kim, K. et al., "Enhanced light extraction efficiency of GaN-based light-emitting diodes with ZnO nanorod arrays grown using aqueous solution," Applied Physics Letters 94, 071118 (2009).

Lange, F., "Chemical solution routes to single-crystal thin films," Science, vol. 273, No. 5277, Aug. 16, 1996, pp. 903-909.

Richardson, J. "Low temperature aqueous deposition of ZnO on GaN LEDs," Presentation slides, SSLEC Annual Review, Nov. 5, 2009.

Thompson, D. et al., "Light emitting diodes with ZnO current spreading layers deposited from a low temperature aqueous solution," Applied Physics Express 2 (2009) 042101.

Zhong, J. et al., "Integrated ZnO nanotips of GaN light emitting diodes for enhanced emission efficiency," Applied Physics Letters 90, 203515 (2007).

Andeen, D. et al., "Lateral epitaxial overgrowth of ZnO in water at 90oC," Adv. Funct. Mater. 2006, 16, pp. 799-804.

Chang, K. et al., "Investigation of indium-tin-oxide ohmic contact to p-GaN and its application to high-brightness GaN-based light-emitting diodes," Solid-State Electronics 49 (2005), pp. 1381-1386.

Ellmer, K. et al., "Resistivity of polycrystalline zinc oxide films: current status and physical limit," Journal of Physics D. 34(21), 2001, pp. 3097-3108.

Horng, R. et al., "GaN-based light-emitting diodes with indium tin oxide texturing window layers using natural lithography," Applied Physics Letters 86, 221101 (2005).

Li, W. et al., "Growth mechanism and growth habit of oxide crystals," Journal of Crystal Growth 203 (1999) pp. 186-196.

Margalith, T. et al., "Indium tin oxide contacts to gallium nitride optoelectronic devices," Applied Physics Letters, vol. 74, No. 26, Jun. 28, 1999, 3930.

Mariano, A. et al., "Crystallographic polarity of ZnO crystals," Journal of Applied Physics, vol. 34, No. 2, Feb. 1963, pp. 384-388.

Murai, A. et al., "Hexagonal pyramid shaped light-emitting diodes based on ZnO and GaN direct wafer bonding," Applied Physics Letters 89, 171116 (2006).

Murai, A. et al., "Mega-cone blue LEDs based on ZnO/GaN direct wafer bonding," Phys. Stat. Sol. (c) 4, No. 7, (2007), pp. 2756-2759.

Nakahara, K. et al., "Improved external efficiency InGaN-based light-emitting diodes with transparent conductive Ga-doped ZnO as p-electrodes," vol. 43, No. 2A, 2004, pp. L180-L182.

Oner, M. et al., "Control of ZnO crystallization by a PEO-b-PMAA diblock copolymer," Chem. Mater. 1998, 10, pp. 460-463.

Perkins et al., "A Liquid-Phase Quartz Crystal Microbalance for Photovoltaics Research", National Renewable Energy Laboratory, Dec. 31, 2008, pp. 1-5.

Richardson, J. et al., "Controlling low-temperature aqueous synthesis of ZnO. 1. Thermodynamic analysis," Crystal Growth & Design, vol. 9, No. 6, 2009, pp. 2570-2575.

Richardson, J. et al., "Controlling low-temperature aqueous synthesis of ZnO. 2. A novel continuous circulation reactor," Crystal Growth & Design, vol. 9, No. 6, 2009, pp. 2576-2581.

Richardson et al., "Rapid synthesis of epitaxial ZnO films from aqueous solution using microwave heating", Journal of Materials Chemistry, The Royal Society of Chemistry 2010.

Schmidt-Mende et al., "ZnO—nanostructures, defects, and devices", Department of Materials Science, May 2007, vol. 10, No. 5, pp. 40-48.

Sheu, J. et al., "Enhanced efficiency of GaN-based light-emitting diodes with periodic textured Ga-doped AnO transparent contact layer," Applied Physics Letters 90, 263511 (2007).

Song, J. et al., "Highly low resistance and transparent Ni/ZnO ohmic contacts to p-type GaN," Applied Physics Letters, vol. 83, No. 3, Jul. 21, 2003, 479.

Sounart et al., "Sequential Nucleation and Growth of Complex Nanostructured Films", Advanced Functional Materials, 2006, 16, pp. 335-344.

Thompson, D. et al., ABSt 7th Int. Conf. Nitride Semiconductors, 2007, A3, 3 pages.

Tian, Z. et al., "Complex and oriented ZnO nanostructures," Nature Materials, vol. 2, Dec. 2003, pp. 821-826.

Van de Walle, C., "Hydrogen as a cause of doing in zinc oxide," Physical Review Letters, 85(5), 2000, pp. 1012-1015.

Van de Walle, C. et al., "Universal alignment of hydrogen level in semiconductors, insulators and solutions," Nature, vol. 432, Jun. 5, 2003, pp. 626-628.

Chinese Office Action (with English translation) dated Apr. 30, 2014 for Chinese Patent Application No. 201080049857.2.

Japanese Office Action (with English translation) dated Apr. 1, 2014 for Japanese Patent Application No. 2012-537210.

* cited by examiner

LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS

CROSS REFERENCE TO RELATED APPLICATIONS

This application is a continuation under 35 U.S.C. §120 of co-pending and commonly-assigned U.S. Utility patent application Ser. No. 12/938,872, filed on Nov. 3, 2010, by Jacob J. Richardson, Daniel B. Thompson, Ingrid Koslow, Jun Seok Ha, Frederick F. Lange, Steven P. DenBaars, and Shuji Nakamura, which application claims priority under 35 U.S.C. §119(e) of the following co-pending and commonly-assigned U.S. Provisional Patent Applications:

U.S. Provisional Patent Application Ser. No. 61/257,811, entitled "A LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS," filed on Nov. 3, 2009, by Jacob J. Richardson, Daniel B. Thompson, Ingrid Koslow, Jun Seok Ha, Frederick F. Lange, Steven P. DenBaars, and Shuji Nakamura;

U.S. Provisional Application Ser. No. 61/257,812, filed on Nov. 3, 2009, by Daniel B. Thompson, Jacob J. Richardson, Ingrid Koslow, Jun Seok Ha, Frederick F. Lange, and Steven P. DenBaars, and Shuji Nakamura, entitled "HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION"; and U.S. Provisional Application Ser. No. 61/257,814, filed on Nov. 3, 2009, by Daniel B. Thompson, Jacob J. Richardson, Steven P. DenBaars, Frederick F. Lange, and Jin Hyeok Kim, entitled "LIGHT EMITTING DIODES WITH ZINC OXIDE CURRENT SPREADING AND LIGHT EXTRACTION LAYERS DEPOSITED FROM LOW TEMPERATURE AQUEOUS SOLUTION";

all of which applications are incorporated by reference herein.

This application is related to the following co-pending and commonly-assigned U.S. patent applications:

U.S. Utility patent application Ser. No. 12/761,246, filed on Apr. 15, 2010, by Jacob J. Richardson and Frederick F. Lange, entitled "LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS", which application claims priority under 35 U.S.C. §119(e) to co-pending and commonly-assigned U.S. Provisional Patent Application Ser. No. 61/169,633, filed on Apr. 15, 2009, by Jacob J. Richardson and Frederick F. Lange, entitled "LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS";

U.S. Utility application Ser. No. 12/938,948, filed Nov. 3, 2010, by Daniel B. Thompson, Jacob J. Richardson, Ingrid Koslow, Jun Seok Ha, Frederick F. Lange, and Steven P. DenBaars, and Shuji Nakamura, entitled "HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION", which application claims priority under 35 U.S.C. §119(e) to co-pending and commonly-assigned U.S. Provisional Application Ser. No. 61/257,812, filed on Nov. 3, 2009, by Daniel B. Thompson, Jacob J. Richardson, Ingrid Koslow, Jun Seok Ha, Frederick F. Lange, and Steven P. DenBaars, and Shuji Nakamura, entitled "HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION"; and U.S. Utility application Ser. No. 12/939,044, filed Nov. 3, 2010, by Daniel B. Thompson, Jacob J. Richardson, Steven P. DenBaars, Frederick F. Lange, and Jin Hyeok Kim, entitled "LIGHT EMITTING DIODES WITH ZINC OXIDE CURRENT SPREADING AND LIGHT EXTRACTION LAYERS DEPOSITED FROM LOW TEMPERATURE AQUEOUS SOLUTION", which application claims priority under 35 U.S.C. §119(e) to co-pending and commonly-assigned U.S. Provisional Application Ser. No. 61/257,814, filed on Nov. 3, 2009, by Daniel B. Thompson, Jacob J. Richardson, Steven P. DenBaars, Frederick F. Lange, and Jin Hyeok Kim, entitled "LIGHT EMITTING DIODES WITH ZINC OXIDE CURRENT SPREADING AND LIGHT EXTRACTION LAYERS DEPOSITED FROM LOW TEMPERATURE AQUEOUS SOLUTION";

which applications are incorporated by reference herein.

BACKGROUND OF THE INVENTION

1. Field of the Invention

This invention relates to high brightness Light Emitting Diodes (LEDs) and methods and devices that improve light extraction efficiency of LEDs without substantially increasing device cost.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

There are several previous publications dealing with the use of Zinc Oxide (ZnO) nanorods for enhancing light extraction efficiency from GaN LEDs. Zhong et al. report on a metal organic chemical vapor deposition (MOCVD) grown ZnO nanorod array, on top of a ZnO:Ga transparent contact layer deposited on (0001) p-GaN [1]. Compared to a conventional Ni/Au contact, they report a ~1.7 times increase in light emission efficiency.

Also using MOCVD (or MOVPE) growth, An et al. then reported on the light output from the same device, before and after growing ZnO nanorod arrays on the surface [2]. Here, the nanorods reportedly produced a ~50% increase in output at 20 mA, and a ~100% increase at 50 mA. Despite these improvements in light extraction, these methods are unlikely to see commercial application due to the high cost and low throughput that would be associated with using MOCVD growth for of ZnO nanorods.

However, Kim et al. recently reported on the growth of a ZnO nanorod array using an aqueous solution route [3]. In this case, the nanorods were able to improve light output by almost 60%. Compared with MOCVD growth, aqueous solution deposition can be a lower cost and higher throughput method [4]. This could drastically reduce the cost and make ZnO nanorod arrays a commercially feasible option for enhancing the light extraction efficiency of GaN LEDs.

All of the reports described above dealt solely with ZnO nanorod arrays situated on the $c^+$-plane (0001) surface of the LED, either deposited directly onto the p-GaN or onto an intermediate layer. However, according to the present invention this is not the only type of LED device surface where ZnO nanorods could potentially enhance light extraction. For instance, in most laser lift off device configurations nanorods would instead need to be grown on the c⁻ plane (000-1).

For devices grown on bulk GaN substrates, the present invention describes that ZnO nanorod arrays could potentially improve light extraction from any of the surfaces of the device. Depending on the LED's orientation and cut, this could include the polar c⁺ and c⁻-planes, the non-polar m- and a-planes, and numerous semi-polar planes. In some cases it may also be useful to produce nanorods on top of non-GaN LED device surfaces, such as substrates, and transparent contact or current spreading layers.

SUMMARY OF THE INVENTION

Light extraction technology has proven to be critical for obtaining high brightness, high efficiency LEDs. To improve light extraction efficiency, surface texturing or roughening methods are often used to expand the effective escape cone for light generated within the LED. Recently, several reports have indicated that surface arrays of ZnO nanorods can help increase the light output power from GaN based LEDs. These reports have focused exclusively on using nanorod arrays only on the (0001) p-GaN surface of the LED structure. However, the (0001) is not the only surface at which light can be internally reflected. Therefore, it should be possible to enhance light extraction by using ZnO nanorod arrays on other surfaces as well.

The present invention introduces a new LED structure utilizing ZnO nanorods on surfaces other than the (0001) surface, and/or on multiple surfaces of the LED. The present invention also shows that such ZnO nanorod arrays can be synthesized using low cost solution processing methods. Using this type of method, nanorod arrays can be produced on various LED device surfaces, including both Ga and N faced c-plane surfaces, non-polar and semi-polar surfaces, and even non-GaN surfaces, such as substrates and transparent current spreading layers. This method of forming ZnO nanorod arrays can be applied to enhancing light output power from both lateral and vertical type LEDs.

To overcome the limitations in the prior art, and to overcome other limitations that will become apparent upon reading and understanding the present specification, the present invention discloses a method of fabricating an LED with improved light extraction efficiency, comprising growing a plurality of Zinc Oxide (ZnO) nanorods on one or more light transmitting surfaces of a III-Nitride based LED, such that the nanorods are on average oriented normal the light transmitting surface on which they are grown, and wherein the nanorods are grown on at least one light transmitting surface that is different from a c⁺-plane surface of the III-Nitride based LED.

The method may further comprise growing a plurality of Zinc Oxide (ZnO) nanorods on one or more light transmitting surfaces of a III-Nitride based LED, such that the nanorods are on average oriented normal the light transmitting surface on which they are grown, while also growing an epitaxial ZnO layer on one or more different III-Nitride surfaces of the same III-Nitride LED.

The growth of the ZnO nanorods and layers may be performed in one or more steps, wherein at least one step involves growing ZnO from an aqueous solution. The aqueous solution used for ZnO growth may contain dissolved Zn(II) provided by dissolving a soluble Zn(II) salt or by dissolving ZnO. The growth from aqueous solution may be performed at a temperature of less than 100° C. Alternatively, the growth from aqueous solution may be performed at a temperature less than the boiling point of the aqueous solution, wherein that boiling point may be less than or greater than 100° C. The ZnO nanorods of layers may be formed from aqueous solution by a chemical reaction of the dissolved Zn(II) to form ZnO, wherein the chemical reaction is caused, intensified, or otherwise controlled by an increase in the temperature of the growth solution, or by a change in the pH of the growth solution. The conditions, e.g., temperature, constituent concentrations, or pH, of the aqueous growth step may be used to control the orientation, size, and/or shape of the ZnO nanorods and or ZnO layer produced.

The growth of the ZnO layers may include a seed layer deposition step where a nano-crystalline seed layer is formed on one or more surfaces of the III-Nitride LED. A seed layer may be deposited from aqueous solution as described above. Alternatively, a seed layer may be deposited by first depositing a Zn(II) precursor dissolved in a solvent on one or more surfaces to form precursor films, followed by annealing the precursor film to convert the precursor film to a nano-crystalline ZnO film. Alternatively, the nanocrystalline seed may be deposited using a vapor phase method, e.g., sputtering, evaporation, or chemical vapor deposition. The growth of ZnO nanorods or layers may comprise converting the one or more nano-crystalline seed layers by growing further ZnO on the seed layer from an aqueous solution, as described above. The conditions used for the deposition of the Zn(II) precursor film, or for the conversion of the Zn(II) precursor film into a nano-crystalline ZnO layer, may be used to control the orientation, size, and/or shape or the final ZnO nanorods or ZnO layers. The orientation, size, and shape of the ZnO nanorods and/or ZnO layers grown on light transmitting surfaces of the III-Nitride LED may be controlled to enhance the light extraction from those surfaces of the LED.

The light transmitting surfaces may include an N faced c-plane surface, a non-polar plane, and/or a semi-polar plane III-Nitride surface, and/or a non-III-nitride surface of the III-nitride based LED.

The ZnO nanorods may be grown on the III-nitride LED that is fully fabricated, and the growing step may be a final step prior to encapsulation of the LED.

The present invention further discloses an LED, comprising a plurality of ZnO on one or more light transmitting surfaces of a III-Nitride based LED, such that the nanorods are on average oriented normal the light transmitting surface on which they are grown, and wherein the nanorods are grown on at least one light transmitting surface that is different from a c⁺-plane surface of the III-Nitride based LED.

The nanorods may be on a plurality of the surfaces of the III-Nitride LED. The device may comprise a number of the ZnO nanorods, each with one or more dimensions, wherein the number and dimensions enhance extraction of the light from the LED as compared to an LED without the ZnO nanorods. The LED may be a polar, non-polar or semi-polar LED.

BRIEF DESCRIPTION OF THE DRAWINGS

Referring now to the drawings in which like reference numbers represent corresponding parts throughout:

FIG. 1 and FIG. 2 show cross-sectional schematics of examples of LED structures utilizing ZnO nanorod arrays on multiple surfaces, wherein FIG. 1 shows a lateral type device, and FIG. 2 shows a vertical type device.

DETAILED DESCRIPTION OF THE INVENTION

Figure 1:
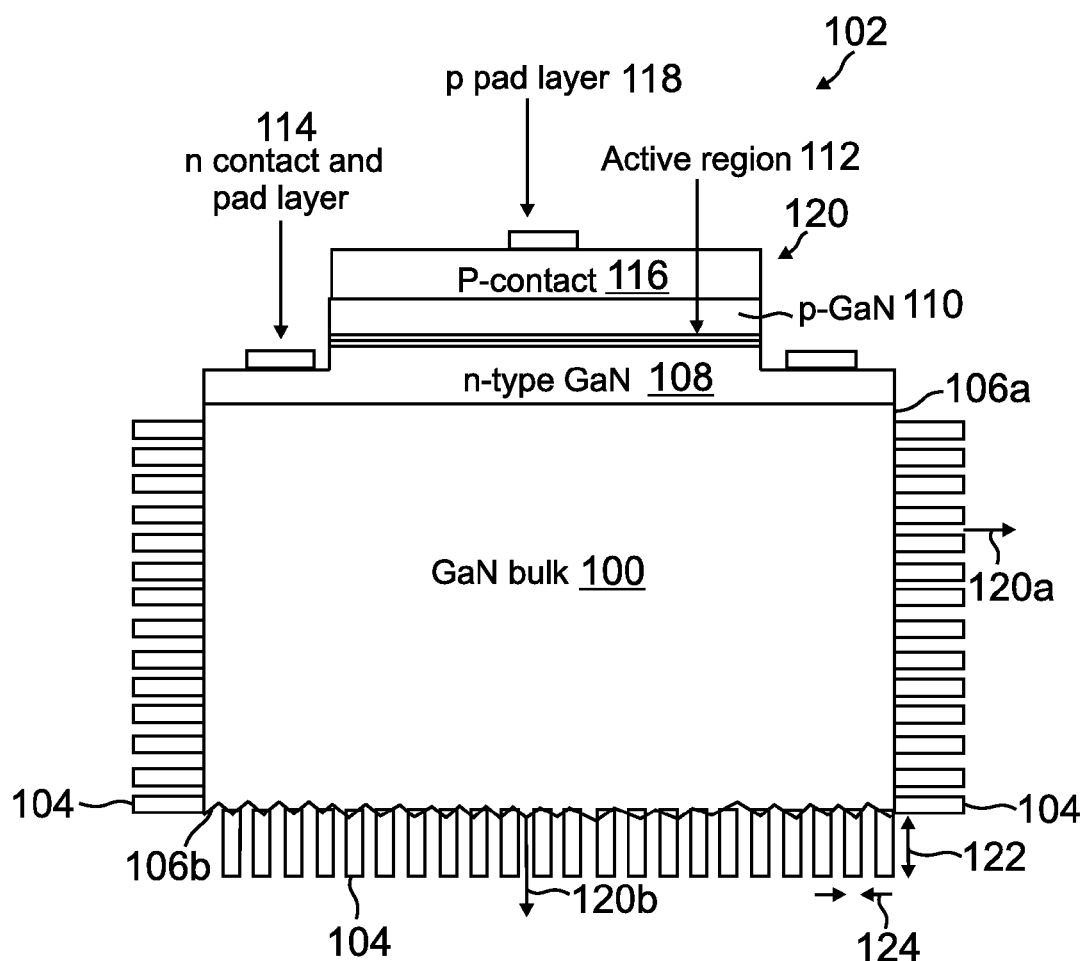

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The purpose of the current invention is to enhance the power output of GaN LED devices. Due to growing energy concerns, efficient LED lighting technology is of current and expanding importance. However, the cost of LED lighting remains high and is a major impediment to the greater implementation of the technology. This invention allows the power output and/or light extraction efficiency of LEDs to be increased without substantially increasing the cost of the device.

Technical Description

Nomenclature

III-nitrides may be referred to as group III-nitrides, nitrides, or by (Al,Ga,In)N, AlInGaN, or $Al_{(1-x-y)}In_yGa_xN$ where $0<x<1$ and $0<y<1$, for example.

These terms are intended to be broadly construed to include respective nitrides of the single species, Al, Ga, and In, as well as binary, ternary and quaternary compositions of such Group III metal species. Accordingly, the terms comprehend the compounds AN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga, In)N materials within the scope of the invention may further include minor quantities of dopants and/or other impurity or inclusional materials. Boron may also be included in the III-nitride alloy.

Similarly, the terms zinc oxide or ZnO are intended to be broadly construed to include any material where the component species Zn and O make up the majority of the compound, and the material retains the hexagonal Wurtzite crystal structure of ZnO. This is inclusive of aluminum doped zinc oxide (AZO), gallium doped zinc oxide (GZO), and indium doped zinc oxide (IZO). This also includes materials with minor quantities of other dopants and/or other impurity or inclusional materials, as well as materials that are off-stoichiometric due to the presence of vacancy and interstitial type material defects.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in GaN or III-nitride optoelectronic devices is to grow the devices on nonpolar planes of the crystal. Such planes contain equal numbers of Ga and N atoms and are charge-neutral. Furthermore, subsequent nonpolar layers are equivalent to one another so the bulk crystal will not be polarized along the growth direction. Two such families of symmetry-equivalent nonpolar planes in GaN or III-nitride are the {11-20} family, known collectively as a-planes, and the {1-100} family, known collectively as m-planes.

Another approach to reducing or possibly eliminating the polarization effects in GaN optoelectronic devices is to grow the devices on semi-polar planes of the crystal. The term "semi-polar planes" can be used to refer to a wide variety of planes that possess both two nonzero h, i, or k Miller indices and a nonzero 1 Miller index. Thus, semipolar planes are defined as crystal planes with nonzero h or k or i index and a nonzero/index in the (hkil) Miller-Bravais indexing convention. Some commonly observed examples of semi-polar planes in c-plane GaN heteroepitaxy include the (11-22), (10-11), and (10-13) planes, which are found in the facets of pits. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

The Gallium or Ga face of GaN is the $c^+$ or (0001) plane, and the Nitrogen or N-face of GaN or a III-Nitride layer is the $c^-$ or (000-1) plane.

The term nanorod is construed as a structure with a maximum diameter less than 1000 nm in the one (lateral) direction and a similar or greater dimension in the orthogonal (longitudinal) direction giving the structure an aspect ratio greater or equal to 1, wherein one longitudinal end of the structure is terminated on a substrate.

LED Structure and Fabrication

The present invention describes a III-Nitride LED structure with ZnO nanorods deposited on a non-$c^+$-plane III-Nitride surface, and/or on multiple surfaces of the device, for enhanced light extraction and/or heat dissipation. In addition, the present invention describes a low cost solution based process for synthesizing the nanorod arrays in such a structure.

Figure 2:
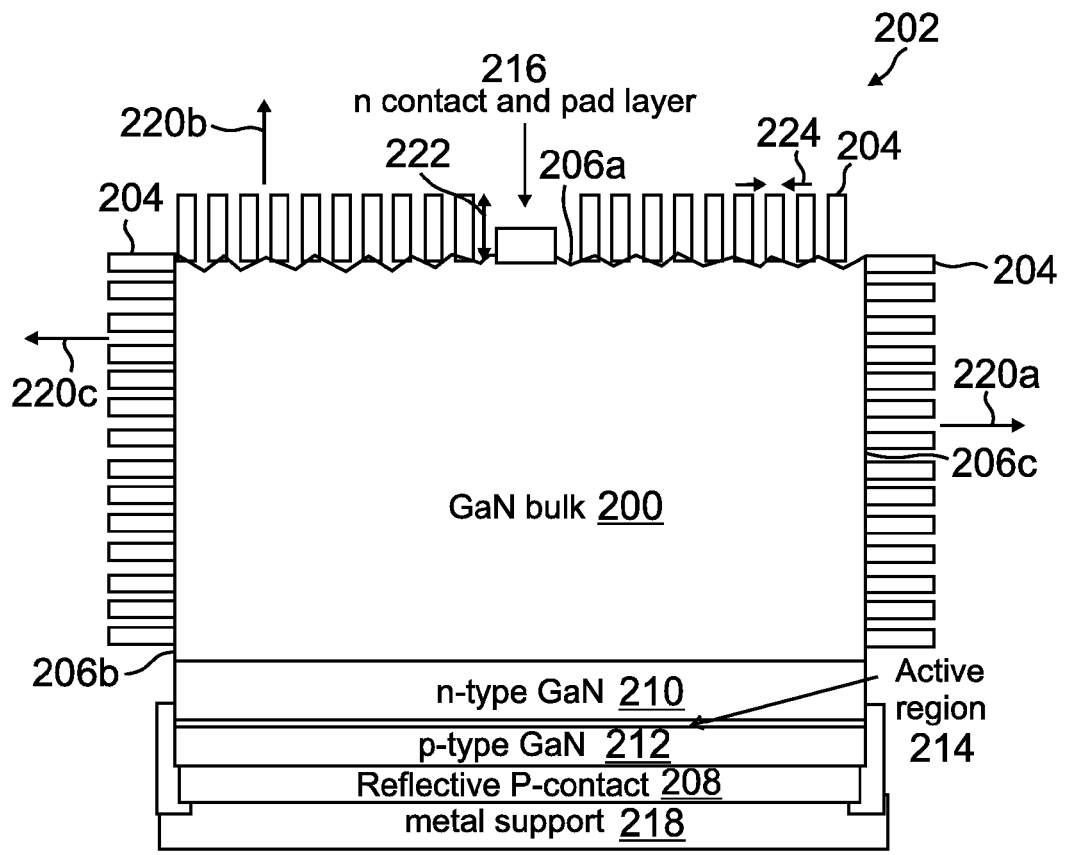

FIG. 1 and FIG. 2 show schematic diagrams of bulk GaN substrate 100, 200 type LED devices 102, 202 utilizing or comprising ZnO nanorod 104, 204 arrays on multiple surfaces 106a, 106b, 206a, 206b, 206c. FIG. 1 shows a lateral type LED 102 and FIG. 2 shows a vertical type LED 202 with reflective p-type contact layer 208.

Multiple variations of these types of structure can be made and multiple processing methods could be used to realize these types of structures. Here, the present invention describes in detail a method where a working LED device (including n-type GaN layer 108, 210, p-type GaN layer 110, 212, active region 112, 214, n-type or n-contact(s) 114, 216, p-type or p-contact(s) 116, 208, and p-pad layers 118) on a bulk GaN substrate 100, 200 is first fully fabricated, and then the ZnO nanorod 104, 204 structures are grown as a final step just before encapsulation.

The present invention fabricated the lateral type LED 102 of FIG. 1 with a typical processing method. First, a region of the LED wafer (comprising layers 108, 110, 112) is mesa-etched to form a mesa 120, removing some of the p-GaN (the p-type GaN layer) 110 and active region layers 112 from the surrounding area using a $Cl_2$ reactive ion etch, and exposing the n-type GaN layer 108. Following that, a p-contact layer (p-type contact) 116 such as Ni/Au, ITO, or ZnO is deposited on the p-type GaN layer 110, and metal contacts 114 of Ti/Al/Ni/Au are deposited on the exposed n-type GaN 108, to form the n-contact and pad layer. A p-pad layer 118 is also deposited on the p-contact layer 116.

For the vertical type LED (FIG. 2) 202, no mesa forming step is necessary, and a highly reflective p-contact layer 208 such as Ag, Al or Rh is deposited directly on the p-GaN 212. These metals can be combined in stacks with higher work function materials to decrease the contact resistance. Also shown in FIG. 2 is metal support 218.

The individual devices are then cut from the wafer so that ZnO nanorod 104, 204 arrays can be fabricated on multiple exposed surfaces 106a-b, 206a-c of the final device.

Specifically, a plurality ZnO nanorods 104, 204 are (e.g., formed non-epitaxially) on one or more light transmitting surfaces 106a-b, 206a-c of a III-Nitride based LED, wherein (1) the light transmitting surfaces 106a, 106b, 206a-c with the ZnO nanorods 104, 204 include one or more surfaces that are different from a $c^+$-plane surface of the III-Nitride LED 102 (e.g., different from a $c^+$ plane of the p-type layer of the III-Nitride based LED), (2) the nanorods 104, 204 are oriented such that on average the longitudinal axis 120a, 120b, 220a, 220b, 220c of a nanorod 104, 204 is parallel to the [0001] (c-direction) of the ZnO nanorod's wurtzite crystal structure and perpendicular to the light transmitting surface 106a, 106b, 206a, 206b, 206c upon which the nanorods 104, 204 are deposited; and (3) a number of the ZnO nanorods 104, 204, each with one or more dimensions (e.g., length 122, 222 and diameter 124, 224) such that the number and/or density and/or dimensions enhance extraction of the light from the LED as compared to an LED without the ZnO nanorods 104, 204. The enhancement of extraction may be by scattering, reduced total internal reflection, diffraction, or photonic crystal effects, for example. The dimensions and/or spacing of the nanorods 104 may be sufficiently close to a wavelength of the light emitted by the LED, for example, so that the light may be scattered, diffracted, reflected, or otherwise interact electro-magnetically with the nanorods.

In some embodiments, the ZnO nanorods 104 may be on top of a ZnO nano-crystalline seed layer, wherein the seed layer is on the light transmitting surface 106a so that the seed layer is between the light transmitting surface and the ZnO nanorods 104.

In the embodiments shown in FIGS. 1 and 2, the light transmitting surfaces include at least one roughened surface 106b. The ZnO nanorods 104, 204 deposited on roughened surfaces 106a may be oriented in a plurality of directions and enhance light extraction. However, in other embodiments, the surface is not roughened.

For example, the non-roughened light transmitting surface 106b may include an N faced c-plane surface of the III-nitride based LED.

In other embodiments, the light transmitting surfaces 106a-c include one or more non-polar planes and/or one or more semi-polar planes, and/or non-GaN or non-III-nitride surface(s), of the III-nitride based LED.

The LED 102 may be a polar c-plane LED or not a c-plane LED (e.g., a non-polar or semi-polar LED). C-plane LEDs are grown in the c-direction of the III-nitride material so that the final or top surface of the LED is a polar c-plane, whereas non-polar or semi-polar LEDs are grown in the non-polar or semi-polar direction of the III-nitride material, so that the final or top surface of the LED is a non-polar or semi-polar plane and the LED experiences reduced or eliminated polarization effects.

ZnO Nanorod Synthesis

Zinc oxide shares the Wurtzite crystal structure and is well lattice matched with GaN, a fact that will encourage the epitaxial growth of ZnO on GaN. However, to achieve the greatest light extraction, ZnO nanorods should always be oriented normal to the LED surface. Since ZnO nanorods always form with the long axis oriented in the c-direction, this means that surface normal nanorods can only be grown epitaxially on the basal planes (e.g., c-planes) of GaN, where the c-direction of the ZnO is aligned with the c-direction of the GaN.

Therefore, to form surface normally oriented ZnO nanorods on the other surfaces of GaN LEDs, epitaxial growth cannot be used. However, even on the basal planes of GaN, epitaxial growth may not be preferred. This is due to the fact that a wide range of heteroepitaxial growth conditions will lead to films rather than nanorods on the basal planes of GaN [5].

For these reasons, a method capable of growing ZnO nanorod arrays on multiple GaN surfaces should be able to inhibit epitaxial growth. If epitaxy is prevented, most of the ZnO rods that result will tend to have their longitudinal axis oriented normal to the LED surface. This occurs for several reasons. First, ZnO will tend to nucleate with a basal plane orientation to minimize surface energy. These oriented nuclei then grow into oriented rods. Secondly, oriented nanorods will tend to dominate due to the fact that non-oriented rods are self-terminating. Because ZnO grows preferentially in the c-direction, non-oriented rods will quickly run into adjacent rods, ending their growth. At the same time, oriented rods can grow unimpeded.

Epitaxial ZnO growth can be prevented by controlling the conditions under which nucleation occurs, or by depositing an interfacial layer to disrupt the lattice alignment between GaN and ZnO. In the procedure detailed below, epitaxy is minimized by only controlling the conditions for nucleation and growth. However, the deposition of an interfacial layer could be added without significantly modifying the rest of the procedure.

Figure 3A:
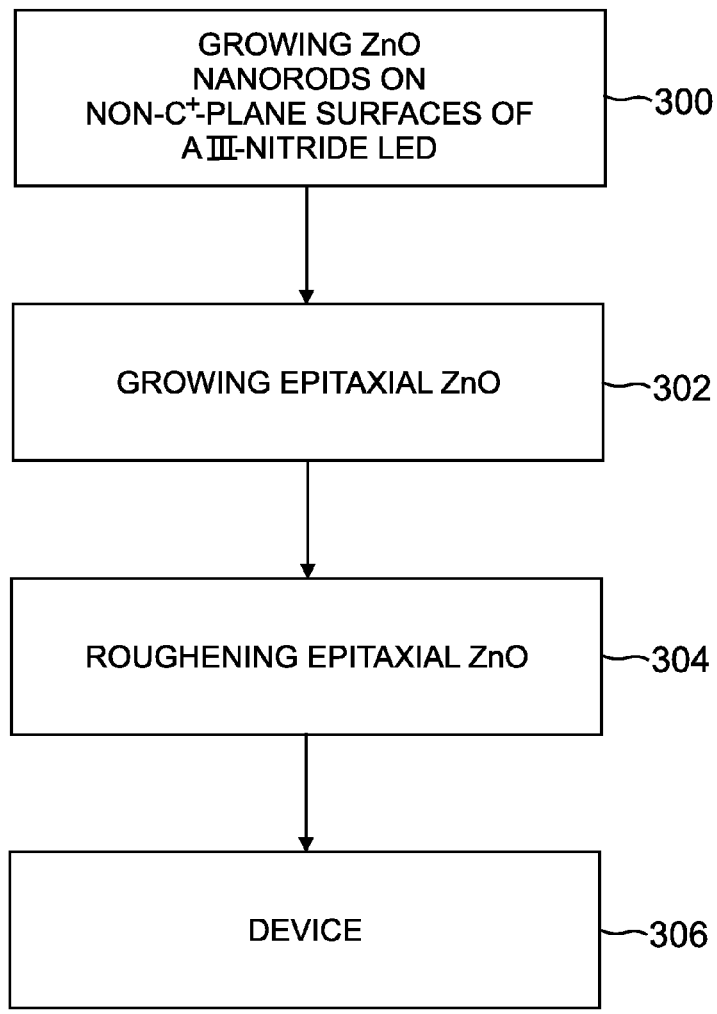
FIG. 3(*a*) is a flowchart illustrating a first embodiment of a method of synthesizing ZnO on an LED, and FIG. 3(*b*) is a flowchart illustrating a second embodiment of a method of synthesizing ZnO on an LED.

Block 300 of FIG. 3(a) illustrates a method of fabricating an LED with improved light extraction efficiency, comprising growing a plurality of ZnO nanorods on one or more light transmitting surfaces of a III-Nitride based LED, wherein the ZnO nanorods are grown on at least one light transmitting surface that is different from a $c^+$-plane surface (e.g., growing the nanorods on non-$c^+$ plane surfaces) of the III-Nitride based LED, or the LED is not a c-plane LED.

The growing of the ZnO nanorods may be from an aqueous solution containing dissolved Zn(II), by means of a chemical reaction involving the dissolved Zn(II), wherein the ZnO nanorods are formed on a surface of the III-Nitride LED in contact with the aqueous solution.

The orientation, size, and shape of the ZnO nanorods and/or ZnO layers grown on light transmitting surfaces of the III-Nitride LED may be controlled to enhance the light extraction from those surfaces of the LED.

The growing may be under conditions to inhibit epitaxial growth on the LED, by controlling the conditions under which nucleation occurs, or by depositing the interfacial layer between the LED and the ZnO to disrupt lattice alignment between the LED material and the ZnO. The growing may be from an aqueous solution, and the growing may be at a temperature below the boiling point of the aqueous solution such that the aqueous solution is a liquid aqueous solution. The growing may be from an aqueous solution at a temperature below 100° C., for example.

The ZnO nanorods may be grown on the III-nitride LED that is fully fabricated, and the growing step may be a final step prior to encapsulation of the LED.

Block 302 represents optionally depositing one or more epitaxial ZnO layers on one or more surfaces of the III-Nitride LED that are different from the light transmitting surfaces where the ZnO nanorods are grown.

Block 304 represents optionally roughening the epitaxial ZnO layers to enhance light extraction from the LED.

Block 306 represents the end result of the method, a device. The device may comprise a plurality of Zinc Oxide (ZnO) nanorods on one or more light transmitting surfaces of a III-Nitride based LED, wherein the light transmitting surfaces with the ZnO nanorods include at least one surface that is different from a $c^+$-plane surface of the III-Nitride based LED. An epitaxial ZnO layer may optionally be on one or more surfaces of the III-Nitride LED that are different from the light transmitting surfaces where the ZnO nanorods are grown. However, as noted above, the step in Block 302 may be omitted, or the steps of Blocks 302 and 304 may be omitted, or Blocks 302 and 304 may be performed prior to Block 300, for example.

Figure 3B:
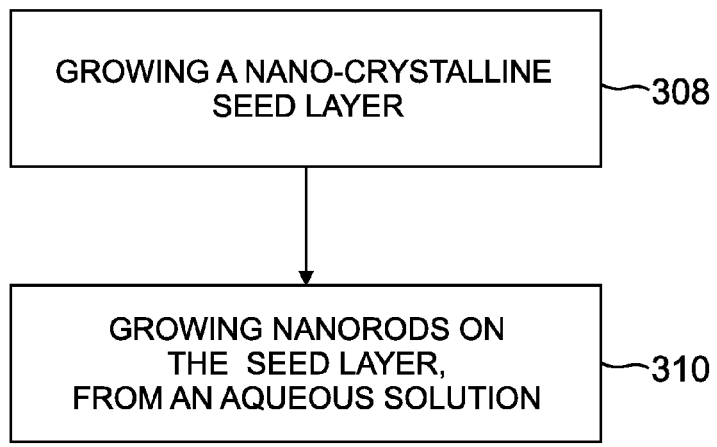

In one example of the above method, ZnO nanorod arrays can be formed or grown on any arbitrary surface of an (e.g., GaN) LED using a two-step process. An example of the growing of Block 300 using the two step method is illustrated in FIG. 3(*b*) and described below.

Seed Layer Deposition

In the first step, represented by Block 308, a nano-crystalline seed layer is deposited or grown on the surfaces.

To accomplish this several methods could be used, including low temperature aqueous solution deposition, a solution based precursor deposition and conversion, or a vapor phase deposition technique. Whatever the technique used, conditions should be optimized to reduce the nucleation of epitaxial ZnO, especially on non-c-plane GaN surfaces. How this is achieved will depend on the particular method used, but in general it is important to avoid high temperatures during processing. High temperatures allow diffusion, which in can turn allow non-epitaxial ZnO to recrystallize into epitaxial ZnO. Conditions affecting the ZnO grain size in the seed layer are also of particular importance, as the seed crystal size will effectively establish the minimum ZnO rod diameter. Thus, the present invention may grow ZnO at temperatures sufficiently low to prevent diffusion and/or conditions that produce seed crystal grain sizes that allow nanorod growth.

Figure 4A:
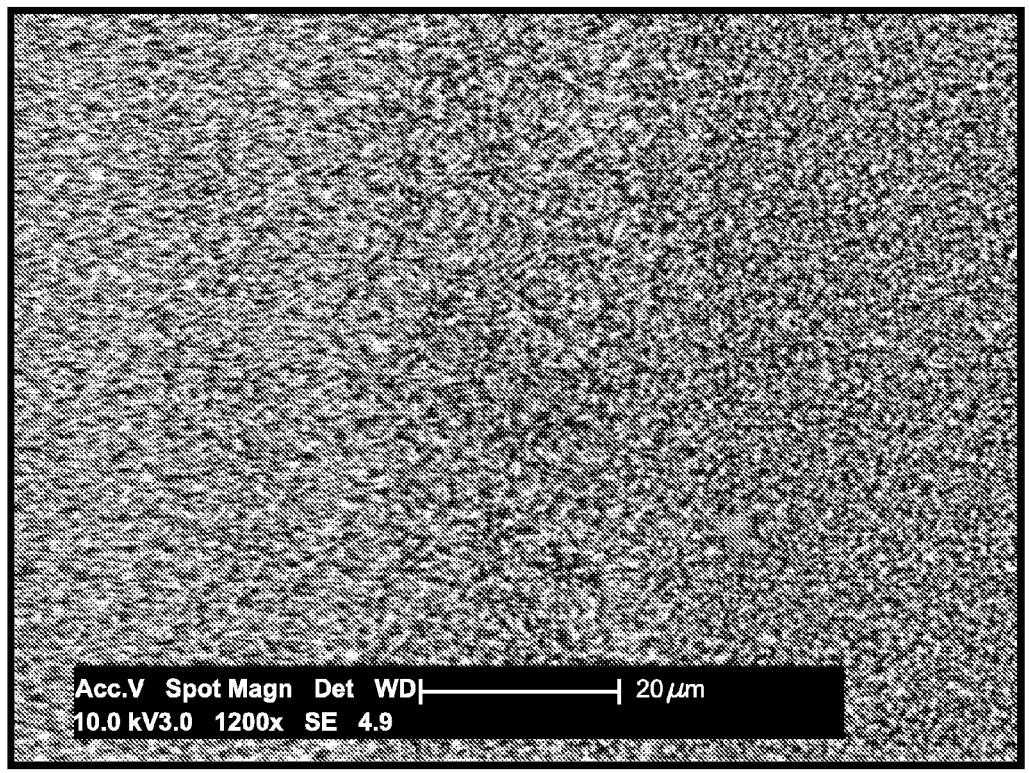
FIGS. 4(a) and 4(b) show nanorods grown with a low temperature aqueous solution method on the non-polar GaN surface of a bulk GaN substrate LED.
Figure 4B:
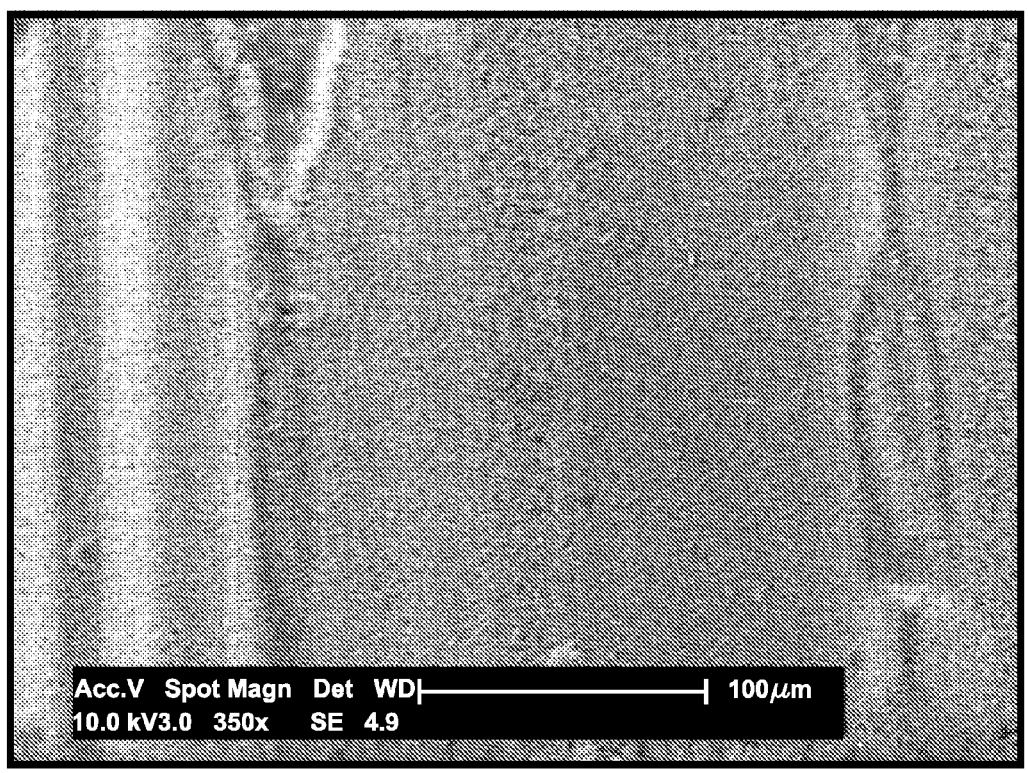

FIG. 4(*a*) and FIG. 4(*b*) are photographs illustrating a top view of ZnO nanorods (viewed from the end, showing the end of the nanorods) fabricated using the method of the present invention. The light spots in FIGS. 4*a* and 4*b* illustrate the ends or tips of the ZnO rods as viewed from the top.

The experimental results shown in FIG. 4(*a*)-(*b*) were obtained using a chemical solution deposition of a precursor film followed by a conversion technique to create the nano-crystalline ZnO seed layer. For example, the nano-crystalline seed layer may be deposited by depositing a solution comprising a Zn(II) precursor dissolved in a solvent on each of the surfaces, to form a precursor film; and then heating or annealing the film to pyrolize the Zn(II) precursor and crystallize a nano-crystalline ZnO film that is the nano-crystalline seed. To create the chemical precursor solution, zinc(II) acetate dehydrate was dissolved in ethanol at a concentration of 0.5 mol/L along with 0.5 mol/L diethanolamine. The addition of diethanolamine serves to increase the solubility of the zinc(II) acetate in solution, as well modify the viscosity and drying behavior of the solution. Other solution formulations could be substituted. The precursor solution was then deposited on the desired surfaces by spin coating. The same solution could also be deposited by other methods, such as dip coating or spray coating. The resulting precursor film was then converted to nanocrystalline ZnO using a rapid thermal annealing treatment to 600° C. in an $N_2/O_2$ atmosphere. This treatment both pyrolized and crystallized the film, but the pyrolysis and crystallization stages could also be performed separately with a lower temperature treatment followed by a higher temperature treatment.

Alternatively, the nanocrystalline seed may be deposited using a vapor phase method, e.g., sputtering, evaporation, or chemical vapor deposition.

Aqueous Conversion of ZnO Seed Layers to a Nanorod Arrays

After the seed layer deposition, a second step (Block 310) grows the nanocrystalline ZnO seeds into an array of nanorods. This is accomplished by converting the nano-crystalline seed layer to the ZnO nanorods by growing in an aqueous solution, e.g., the step may comprise growing the plurality of ZnO nanorods on the seed layer, by growing the ZnO nanorods from an aqueous solution.

Growth of ZnO nanorods and films from aqueous solution is well known and many different specific solution conditions can be used for this purpose [10-11]. The specific solution conditions used will, along with the properties of the seed layer, determine the length, width, aspect ratio, orientation, and morphology of the ZnO nanorods formed. Thus, a number of the ZnO nanorods may be grown with a desired number and dimensions, wherein the number and dimensions enhance extraction of the light from the LED as compared to an LED without the ZnO nanorods.

For ZnO rods to form from a stable solution, growth may be initiated by some change in the solution conditions. This, for example, can be achieved with a change in the pressure, pH, temperature, or the concentrations of one or more of the solution components [8]. For the results shown in FIG. 4(*a*)-(*b*), the aqueous growth solution consisted of only zinc(II) nitrate hexahydrate, dissolved ammonia, and water. ZnO was formed from the solution after the solution is heated. To ensure that the reaction has reached completion, the solution was then maintained at 90° C. for a period of 18-24 hours. However, it is likely that the majority of the growth occurs fairly quickly and that the results would be relatively unaffected by significantly shortening the hold time.

The conditions used for the deposition of the Zn(II) precursor film (Block 308), or for the conversion (Block 310) of the Zn(II) precursor film into a nano-crystalline ZnO layer, may be used to control the orientation, size, and/or shape or the final ZnO nanorods or ZnO layers.

ZnO Nanorod and Epitaxial Layers on Different Surfaces

FIG. 5(*a*) is a schematic of an III-Nitride LED 500 comprising an epitaxial ZnO layer 502 on a first surface 504 of the LED 500, and ZnO nanorods or non-epitaxial ZnO 506 on different surfaces 514 of the LED 500. In this embodiment, the epitaxial ZnO layer 502 is grown on the nitrogen terminated (000-1) c-plane surface 504 of a GaN bulk substrate 506, opposite of the LED device layers 508 (n-type layer, active layer, and p-type layer), which are grown on the gallium terminated (0001) c-plane surface 510 of the of the GaN bulk substrate 506. The ZnO nanorods 512 are grown on the sidewall surfaces 514 of the bulk GaN substrate 506. The sidewall surfaces 514 comprise of either m-plane (10-10) or a-plane (11-20) surfaces (i.e, non-polar planes). The surfaces 504 and 514 of the bulk GaN substrate 506 with epitaxial ZnO 502 or ZnO nanorods 512 may be roughened prior to ZnO growth, so that the light transmitting surfaces include at least one roughened surface 504, 514 so that the ZnO nanorods 512 are oriented in a plurality of directions and enhance light extraction.

Figure 5A:
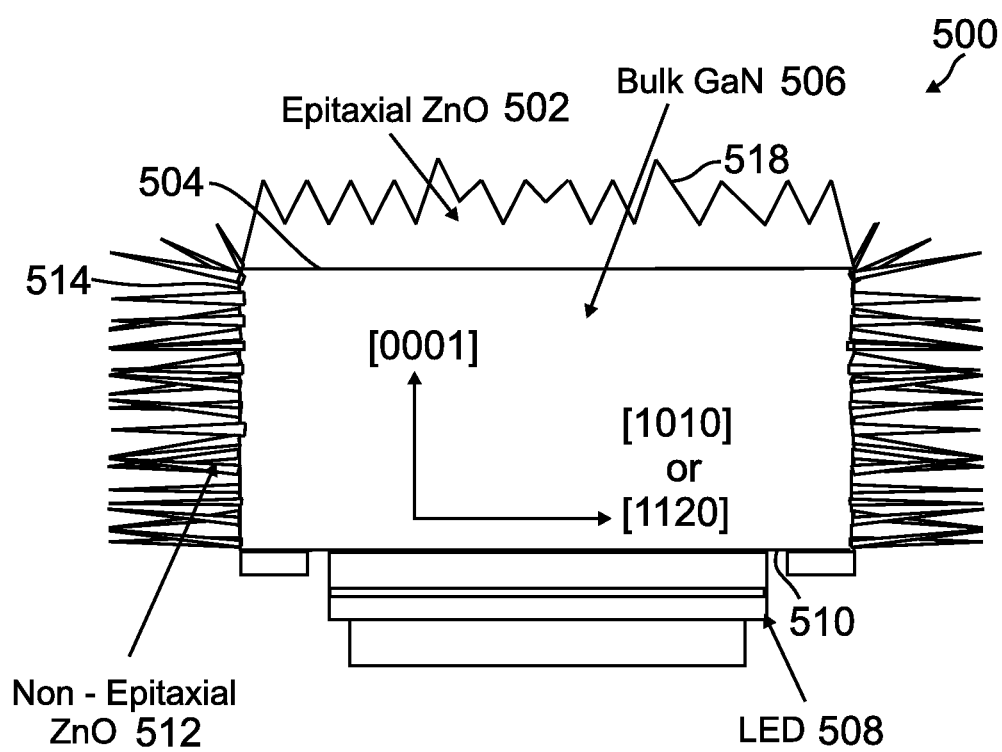
FIG. 5(a) is a cross-sectional schematic of an LED comprising epitaxial and non-epitaxial structures for light extraction.
Figure 5B:
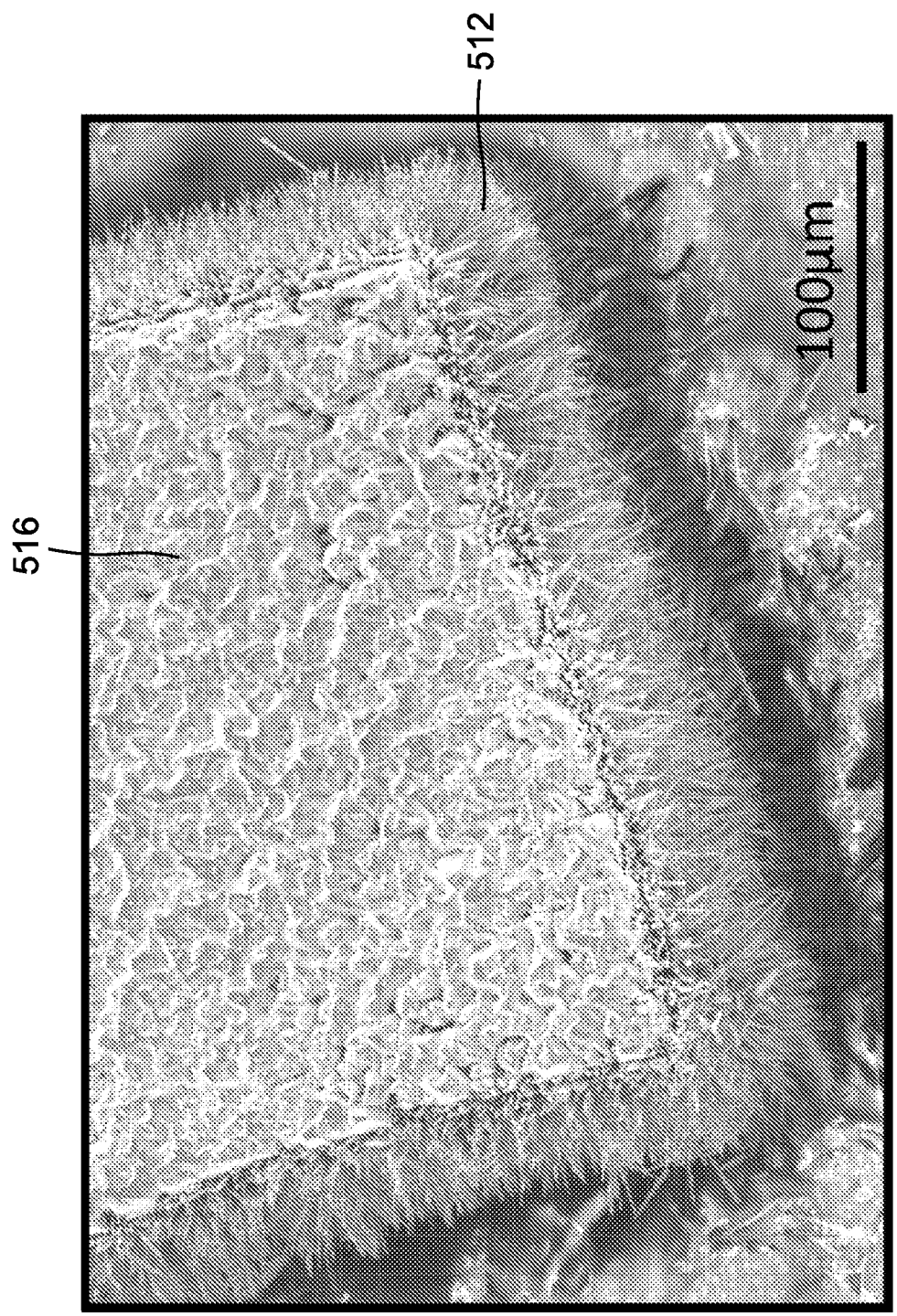
FIG. 5(b) is a scanning electron micrograph (SEM) image of the LED in FIG. 5(a).

FIG. 5(b) is an SEM image of the LED of FIG. 5(a), showing a top surface 516 of the epitaxial ZnO layer 502 that is roughened 518, and the non-epitaxial nanorod structures of ZnO 512 on the sidewalls 514 of the GaN bulk substrate 506. The LED comprises multiple surfaces (epitaxial ZnO 502 and non-epitaxial nanorods 512) adapted for light extraction.

The present invention is able to obtain simultaneous nucleation of epitaxial 502 and ZnO nanorods 506 on different GaN surfaces.

Thus, FIGS. 5(a)-(b) illustrate an embodiment where one or more epitaxial ZnO layers 502 are deposited on one or more surfaces 504 of the III-Nitride LED 500 that are different from the light transmitting surfaces 514 where the ZnO nanorods 506 are grown. FIGS. 5(a)-(b) further illustrate an embodiment wherein the epitaxial ZnO layers 502 are roughened 518 to enhance light extraction from the LED 500.

Advantages and Improvements

The present invention communicated here presents several important advantages over the current state of the art. From the prior art, it is clear that ZnO nanorod arrays applied to c-plane surfaces can impart improved light extraction characteristics to III-Nitride LED devices. By applying ZnO nanorod arrays to previously unused or uncoated surfaces, and or multiple LED surfaces, further enhancement of light extraction is anticipated. This has particular relevance to devices fabricated on bulk GaN because of the numerous types of non-c-plane surfaces that can be used and the larger relative areas of these surfaces as compared to conventional LEDs. The major advantage of the solution based method for ZnO nanorod arrays presented here is the low cost. Compared to high temperature chemical and physical vapor deposition methods, such as VLS (vapor-liquid-solid) or MOCVD, this solution route provides potential cost advantages in equipment, energy, chemical precursors, and throughput. The method presented here is suitable for deposition on to multiple types of LED device surfaces, and the relatively mild conditions used allow for versatility in the process flow schemes that are possible.

REFERENCES

The following references are incorporated by reference herein.

[1] J. Zhong, H. Chen, G. Saraf, Y. Lu, C. K. Choi, J. J. Song, D. M. Mackie and H. Shen: Appl. Phys. Lett. 90 203515 (2007).
[2] Sung Jin An, Jee Hae Chae, Gyu-Chul Yi, and Gil H. Park: Appl. Phys. Lett. 92 121108 (2008).
[3] Kyoung-Kook Kim, Sam-dong Lee, Hyunsoo Kim, Jae-Chul Park, Sung-Nam Lee, Youngsoo Park, Seong-Ju Park, and Sang-Woo Kim: Appl. Phys. Lett. 94 071118 (2009).
[4] Frederick F. Lange: Science vol 273 issue 5277 pg. 903 (1996).
[5] Daniel B. Thompson, Jacob J. Richardson, Steven P. DenBaars, and Frederick F. Lange, entitled "Light Emitting Diodes with ZnO Current Spreading Layers Deposited from a Low Temperature Aqueous Solution," Applied Physics Express 2 (2009) 042101, published online on Mar. 19, 2009.
[6] Presentation Slides given by Jacob Richardson, entitled "Low Temperature Aqueous Deposition of ZnO on GaN LEDs," at the 2009 Annual Review for the Solid State Lighting and Energy Center (SSLEC), University of California, Santa Barbara (Nov. 5, 2009).
[7] J. H. Kim, E. M. Kim, D. Andeen, D. Thompson, S. P. DenBaars, and F. F. Lange: Adv. Funct. Mater. 17 (2007) 463.
[8] U.S. Utility patent application Ser. No. 12/761,246, filed on Apr. 15, 2010, by Jacob J. Richardson and Frederick F. Lange, entitled "LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS".
[9] U.S. Pat. No. 7,265,037B2, entitled "Nanowire array and nanowire solar cells and methods for forming the same," by Yang et. al., issued Sep. 4, 2007.
[10] U.S. Pat. No. 7,767,140 B2, entitled "Method for manufacturing zinc oxide nanowires and device having the same," by Min et. al., issued Aug. 3, 2010.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating a Light Emitting Diode (LED) with improved light extraction efficiency, comprising:
  growing a plurality of Zinc Oxide (ZnO) nanorods on one or more light transmitting surfaces of a III-Nitride based LED, wherein:
  the ZnO nanorods are grown on at least one light transmitting surface that is different from a $c^+$-plane surface of the III-Nitride based LED, and
  the light transmitting surfaces include one or more N faced c-plane surfaces or a semi-polar plane of the III-nitride based LED.

2. The method of claim 1, further comprising growing the ZnO nanorods from an aqueous solution containing dissolved Zn(II), by means of a chemical reaction involving the dissolved Zn(II), wherein the ZnO nanorods are formed on a surface of the III-Nitride LED in contact with the aqueous solution.

3. The method of claim 2, wherein the ZnO nanorods are grown with a two-step process, wherein the first step is the deposition of a nano-crystalline seed layer, and the second step is a conversion of the nano-crystalline seed layer to the ZnO nanorods by growing in an aqueous solution.

4. The method of claim 3, wherein the deposition of the nano-crystalline seed layer is deposited by depositing a solution comprising a Zn(II) precursor dissolved in a solvent to create a precursor film, and then heating the precursor film to pyrolize the Zn(II) precursor and crystallize a nano-crystalline ZnO film that is the nano-crystalline seed.

5. The method of claim 1, wherein one or more epitaxial ZnO layers are deposited on one or more surfaces of the III-Nitride LED that are different from the light transmitting surfaces where the ZnO nanorods are grown.

6. The method of claim 5, wherein the epitaxial ZnO layers are roughened to enhance light extraction from the LED.

7. The method of claim 1, wherein the light transmitting surfaces include a non-polar plane of the III-nitride based LED.

8. The method of claim 1, wherein the light transmitting surfaces include a non-GaN or non-III-nitride surface of the III-nitride based LED.

9. The method of claim 1, wherein the LED is a non-polar or semi-polar LED.

10. The method of claim 1, wherein the ZnO nanorods are on a plurality of the surfaces.

11. The method of claim 1, wherein the ZnO nanorods are grown on the III-nitride LED that is fully fabricated, and the growing step is a final step prior to encapsulation of the LED.

12. A method of fabricating a Light Emitting Diode (LED) with improved light extraction efficiency, comprising:
    growing a plurality of Zinc Oxide (ZnO) nanorods on one or more light transmitting surfaces of a III-Nitride based LED, wherein:
    the ZnO nanorods are grown on at least one light transmitting surface that is different from a c+-plane surface of the III-Nitride based LED, and
    the light transmitting surfaces include at least one roughened surface, so that the ZnO nanorods are oriented in a plurality of directions and enhance light extraction.

13. A III-Nitride based Light Emitting Diode (LED), comprising:
    a plurality of Zinc Oxide (ZnO) nanorods on one or more light transmitting surfaces of a III-Nitride based LED, wherein:
    the light transmitting surfaces with the ZnO nanorods include at least one surface that is different from a c+-plane surface of the III-Nitride based LED, and
    the light transmitting surfaces include an N faced c-plane surface or a semi-polar plane of the III-nitride based LED.

14. The LED of claim 13, wherein the ZnO nanorods are on top of a ZnO nano-crystalline seed layer.

15. The LED of claim 13, wherein the light transmitting surfaces include a non-polar plane of the III-nitride based LED.

16. The LED of claim 13, wherein the light transmitting surfaces include a non-GaN surface of the III-nitride based LED.

17. The LED of claim 13, wherein the LED is a non-polar or semi-polar LED.

18. The LED of claim 13, wherein the ZnO nanorods are on a plurality of the light transmitting surfaces.

19. The LED of claim 13, wherein an epitaxial ZnO layer is on one or more surfaces of the III-Nitride LED that are different from the light transmitting surfaces where the ZnO nanorods are grown.

20. A III-Nitride based Light Emitting Diode (LED), comprising:
    a plurality of Zinc Oxide (ZnO) nanorods on one or more light transmitting surfaces of a III-Nitride based LED, wherein:
    the light transmitting surfaces with the ZnO nanorods include at least one surface that is different from a c+-plane surface of the III-Nitride based LED, and
    the light transmitting surfaces include at least one roughened surface, so that the ZnO nanorods are oriented in a plurality of directions and enhance light extraction.

* * * * *